(12) United States Patent
Ginetti

(10) Patent No.: US 8,255,845 B2
(45) Date of Patent: Aug. 28, 2012

(54) SYSTEM AND METHOD FOR GENERATING FLAT LAYOUT

(75) Inventor: Arnold Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 124 days.

(21) Appl. No.: 12/789,970

(22) Filed: May 28, 2010

(65) Prior Publication Data

US 2010/0306729 A1   Dec. 2, 2010

Related U.S. Application Data

(63) Continuation of application No. PCT/US 2007/086181, filed on Nov. 30, 2007.

(51) Int. Cl.
*G06F 17/50* (2006.01)

(52) U.S. Cl. ........ 716/100; 716/102; 716/103; 716/104; 716/106

(58) Field of Classification Search ........... 716/100–107
See application file for complete search history.

(56) References Cited

U.S. PATENT DOCUMENTS

| | | | | |
|---|---|---|---|---|
| 6,080,204 A | * | 6/2000 | Mendel | 716/103 |
| 6,536,028 B1 | * | 3/2003 | Katsioulas et al. | 716/125 |
| 2002/0029371 A1 | | 3/2002 | Hwang et al. | |
| 2002/0087939 A1 | * | 7/2002 | Greidinger et al. | 716/2 |
| 2002/0169694 A1 | * | 11/2002 | Stone et al. | 705/27 |
| 2003/0018948 A1 | | 1/2003 | Chang et al. | |
| 2005/0188338 A1 | | 8/2005 | Kroyan et al. | |
| 2006/0190890 A1 | | 8/2006 | Ohashi et al. | |
| 2007/0245281 A1 | * | 10/2007 | Riepe et al. | 716/9 |
| 2008/0046851 A1 | * | 2/2008 | Miczo | 716/7 |
| 2010/0275175 A1 | * | 10/2010 | Abrams et al. | 716/51 |

* cited by examiner

*Primary Examiner* — Paul Dinh

(74) *Attorney, Agent, or Firm* — Kenyon & Kenyon LLP

(57) ABSTRACT

The present invention provides a method for generating flat layout design view that comprises importing port definitions of a first hierarchical block of digital instances from a source as a schematic symbol, importing port definitions of digital instances within the first hierarchical block from the source, instantiating the schematic symbol as a hierarchical layout instance in the flat layout, binding the hierarchical layout instance to the schematic symbol, and embedding digital layout block instances within the design layout by replacing the digital instances of a digital layout block with digital layout instances of a top layout module of the design layout.

20 Claims, 5 Drawing Sheets

SYSTEM AND METHOD FOR GENERATING FLAT LAYOUT

RELATED APPLICATION

This application is a continuation of and claims the benefit of Patent Cooperation Treaty Application No. PCT/US2007/086181, filed Nov. 30, 2007, which is hereby incorporated herein by reference in its entirety.

TECHNICAL FIELD

The present invention relates to systems and methods for creating a flat circuit layout.

DESCRIPTION OF THE RELATED ART

The layout connectivity of mixed signal designs (mixed layout) is often created from a combination of sources such as analog schematic and hardware descriptor language (HDL) files such as Verilog® and VHDL®. The analog schematic provides the analog data portion of the mixed layout such as analog/full custom instances and their hierarchy. The HDL file provides the digital data portion of the mixed layout such as digital standard cells and their hierarchy. During the layout creation process, a simple layout generator typically creates a layout instance for each schematic instance in the schematic. Each layout instance is then bound to the corresponding schematic instance. In this way, the user may be able to trace a layout instance back to its corresponding schematic instance.

FIG. 1 is a block diagram illustrating a conventional method 100 for creating a flat circuit design layout 110. Method 100 starts with an analog circuit schematic 115 and HDL files 117a-b. Flat circuit layout 110 will be created using data from schematic 115 and HDL files 117a-b. Method 100 includes instantiating each of the analog instances 119a-n in analog schematic 115 into corresponding layout instances 120a-n. Each digital instance (i.e., 121a, 121b) defined in HDL file(s) 117a-b will also be instantiated into a corresponding layout instance (i.e., 123a, 123b). Next, the connectivity data of all digital instances stored in HDL file 117a or 117b are imported into schematic 115. To complete flat layout 110, all layout instances are bound to their corresponding schematic instances using the imported connectivity data. In this way, the user may be able to see which layout instance in flat layout 110 is linked or bound to which schematic instance in schematic 115.

Generally, a flat circuit layout is created using some form of design software. The design software may use methods similar or identical to method 100, as described above, to generate a flat design layout. Every time the a circuit designer opens a design file, the design software has to rebind all of the instances in the layout to all of the corresponding instances in the schematic to ensure the accuracy of the flat layout. For complex circuits containing hundreds of thousands of standard cell instances, this process can be very time consuming.

BRIEF SUMMARY OF EMBODIMENTS OF THE INVENTION

According to various embodiments of the invention, systems and methods for resolving connection violations between circuit chains are provided. In accordance with one embodiment of the invention, a method for generating a design layout comprises: importing port definitions of a plurality of blocks of digital instances from a source as digital schematic symbols; importing the port definition of the digital HDL blocks as schematic symbol, creating the schematic composed of both the digital block symbols and the analog portions, importing the digital blocks as layout blocks, generating the layout from the schematic, binding the hierarchical or module layout instance to the schematic symbol; and "embedding" the hierarchical layout block instances. The embedding process consists in replacing an instance of layout block by an instance of the top module of that layout block.

In one embodiment, the source is one or more hardware description language (HDL) files such as, for example, VHDL or Verilog. In another embodiment, port definitions are imported as a symbol within an openAccess database, and the design schematic is created within an openAccess database.

In yet another embodiment, the HDL source is imported as layout blocks within an openAccess database.

In still another embodiment, the method further includes mapping a top hierarchical digital block from the source to a top hierarchical layout block within the design layout; and mapping any sub hierarchical digital block to a sub-hierarchical layout block within the design layout.

In one embodiment, standard cells of the source to are mapped to layout standard cells within the design layout. In another embodiment, the design layout creation process includes mapping each symbolic instance from the schematic design to an equivalent layout instance in the design layout. Each instance in the design layout is bound to the corresponding instance in the schematic.

In still another embodiment, the top hierarchical layout block of the design layout is the topmost hierarchical layout block, and wherein digital instances within the design schematic are bound to digital instances within the design layout.

In another embodiment according to present invention, a method for generating flat layout includes: importing port definitions of a first and second hierarchical blocks or multi-leveled modules from a source file as a first and second schematic symbols to a schematic design, respectively, each of the hierarchical blocks or modules having one or more digital instances; instantiating the schematic symbols to a design schematic; importing each hierarchical block and its digital instances from the source file, wherein the second hierarchical block is a sub-hierarchy of the first hierarchical block; instantiating the first and second symbolic symbols as a first and second hierarchical layout block within the flat layout, respectively, wherein the second hierarchical layout block is a sub-hierarchy block of the first hierarchical layout block; instantiating digital instances of each hierarchical block as layout instances within the flat layout; binding the digital instances within the flat layout to the instances within the design schematic; and embedding digital instances of the second hierarchical layout within the design layout by replacing each digital instance of the second hierarchical layout block with a layout instance in the first hierarchical layout block, thereby creating a virtually flattened layout.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

1. Overview

Before describing the invention in detail, it is useful to describe an example environment in which the invention may be implemented. In one embodiment, the invention can be implemented using a software application such as a design tool running on a computer or computing system. The computer or computing system might be a personal computer, workstation, minicomputer, mainframe, etc. The computer might include various input devices, such as a keyboard, mouse, trackball, etc.; various output devices, such as a monitor, printer, etc.; various communication ports such as network connections, USB ports, serial and parallel I/O ports, etc.; and various storage devices, such as ROM, RAM, disk drives, magnetic disks, magnetic tape drives, etc.

Monitors and printing devices can be used to provide a visual display of the design as well as other ancillary information to aid the developer in the design process, including various GUIs, graphical representations and other information. Storage devices, whether networked or local, can be used to store data and other information including design tools, design kit information, libraries and so on.

Figure 1:
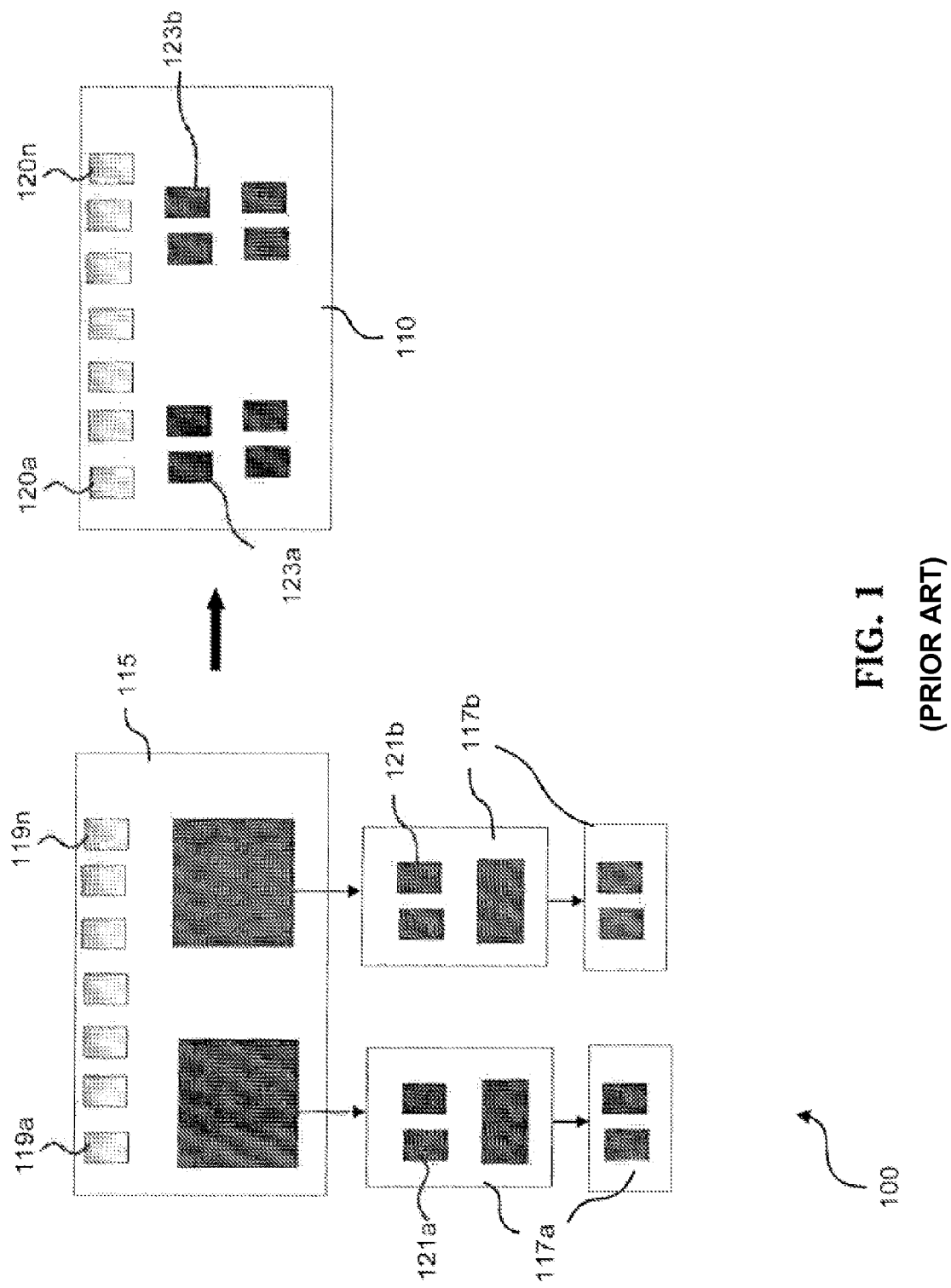
FIG. 1 illustrates a block diagram of a known flat layout generation process.
Figure 2:
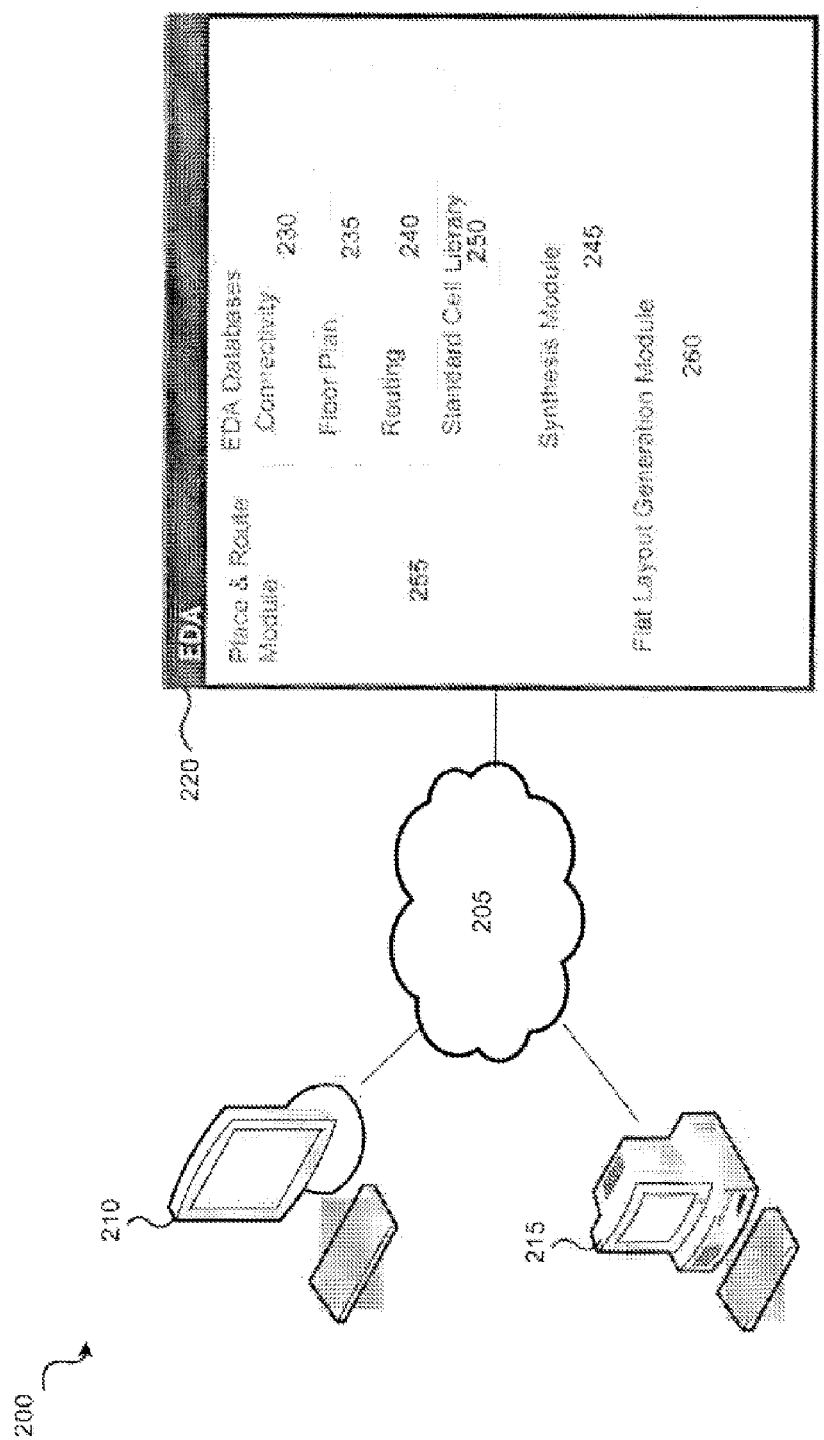
FIG. 2 illustrates an example environment in which an embodiment of the present invention can be implemented.

FIG. 2 illustrates an exemplary environment 200 in which the design tool may be implemented. Environment 200 includes a network 205, a workstation 210, a computer 215, and a design tool 220. Network 105 can be the internet, a local area network (LAN), a wide area network (WAN), the plain old telephone system (POTS), or any other suitable network. As shown in FIG. 2, design tool 220 is coupled to network 205. This enables design tool 220 to communicate with workstation 210 and computer 215. It should be noted that design tool 220, workstation 210 and computer 215 may connect to network 205 using various means such as via a wireless network and/or wired network. Design tool 220 may reside on a server that is connected to network 205. Alternatively, design tool 220 is a stand-alone software application.

Design tool 220 includes a connectivity database 230, a floor plan database 235, a routing database 240, a synthesis tool 245, a standard cell library 250, a routing and placement tool 255, and a flat layout tool 260. As will be apparent from a high-level discussion of the circuit designing process below, various components of design tool 220 are used throughout the circuit designing process.

Figure 3:
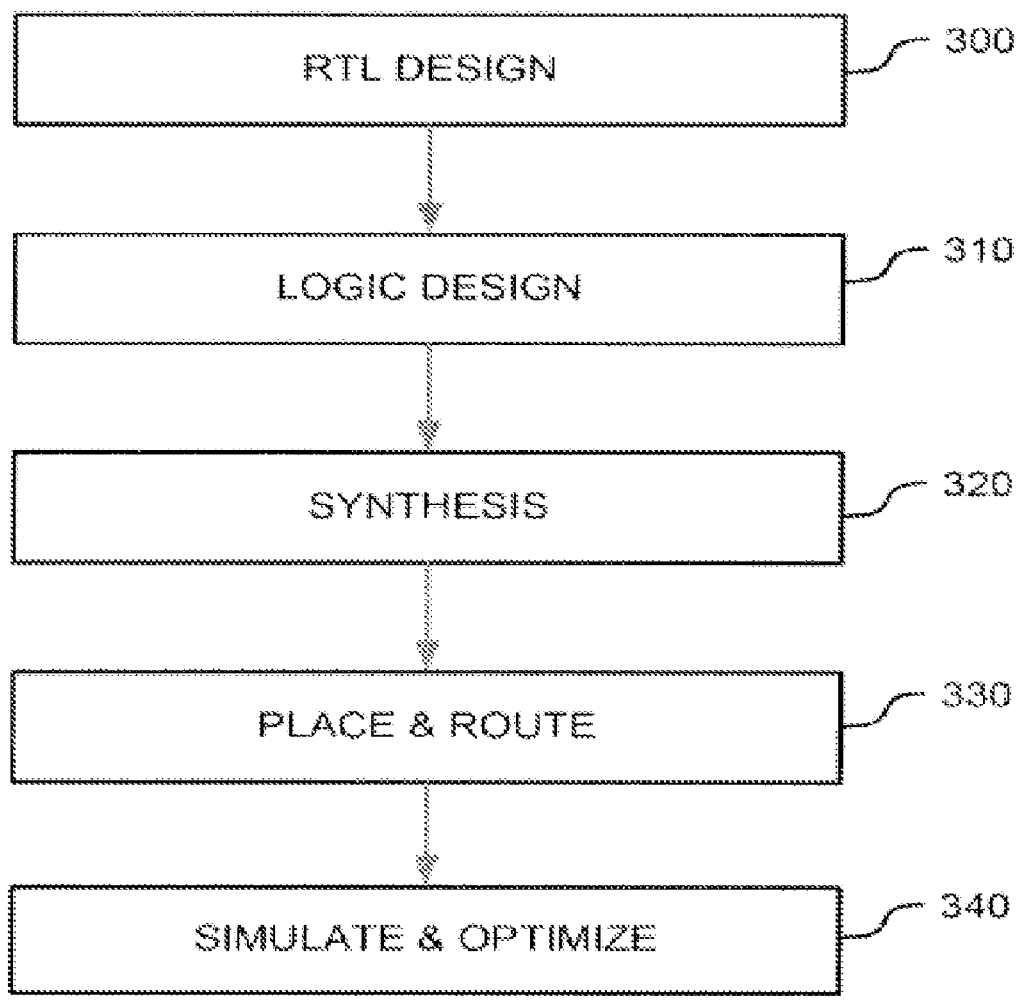
FIGS. 3-4 illustrate process flows implemented by a flat layout generator in accordance with an embodiment of the present invention.

FIG. 3 illustrates an example circuit designing process according to an embodiment of the present invention. Generally, the circuit designing process is a top-down process and it starts with a high-level description of data flow referred to as a register transfer level (RTL) description. In block 300, hardware description languages such as Verilog and VHDL are used to define the behavior of a signal of a circuit on a high level. This typically involves describing the flow of a signal between a register and one or more logic components.

In block 310, the high-level RTL description of the circuit is used to construct a netlist of logic gates that implement the signal's behavior described. This block is also a verification of the chip's architecture as defined in block 300; basically to determine whether the chip's logic components perform as designed.

In block 320, the circuit design is synthesized using the RTL description and the netlist generated. In this block, the circuit is sectioned into functional blocks or cells. Synthesis tool 255 then matches each of the circuit cells with a standard cell or a collection of standard cells stored in standard cell library 250 based on the function and role of the cell. Generally, a cell comprises a plurality of basic circuit elements such as resistors, capacitors, inductors, and transistors for example. A circuit cell may also comprise a single circuit element. Once the functional blocks or cells of a circuit are designed and their corresponding standard cells chosen, a synthesized netlist of the standard cells is produced. This netlist provides the connectivity data of each cell. Connectivity data includes the number of I/O pins of each cell and their connection. A cell may be defined to have one or more I/O pins, each of which may be connected to other I/O pins of another cell or a plurality of cells, which is referred to as a net. At this point in the process, the circuit is ready to be placed and routed.

In block 330, placement and routing tool 255 takes the physical attribute data (i.e., size, ports info, connectivity, and timing) of each standard cell from standard cell library 250 and combines it with the data in the synthesized netlist to fully place and route the circuit. Once the circuit is fully placed and routed, the circuit is optimized and simulated in block 340.

In block 340, time delays between fully placed and routed cells are calculated, which are then used to update each respective standard cell representation in the netlist. The updated netlist is then used to simulate the circuit to determine whether timing and functionality specifications are within design guidelines. The circuit is then optimized for minimal area and timing delay, which help increase the efficiency and performance of the circuit. Typically, several iterations of blocks 320-340 are performed until the final circuit design is reached.

The optimization process may require a circuit designer to revisit the layout view and the analog schematic equivalent of the circuit in order to better visualize the designed circuit. As mentioned, in a conventional design software, every time a circuit design profile is opened, the conventional design software has to rebind all of the instances in the layout to all of the corresponding instances in the schematic to ensure both views are updated and correctly correlated. This process is very time consuming for complex circuits with hundreds of thousands of standard cells. Additionally, connectivity data between layout and schematic instances are mismatched whenever digital optimization is performed on the circuit.

Flat layout tool 260 of design tool 220, according an embodiment of the present invention, provides solution to the above problems by 1) providing isolation between the logical hierarchy of the analog full/custom parts and logical hierarchy of digital parts; 2) embedding standard cell instances within a layout hierarchical instance to conceal the standard cell instances from a binder (e.g., VLS-XL binder); and 3) automatically propagating analog full/custom schematic instances to corresponding layout instances after any changes in the analog schematic, specifically due to an engineering change order (ECO). In this way, circuit designers are presented with a flat circuit layout populated with analog full/custom and digital instances. Preferably, this is performed without having to wait for the binder to rebind all of the digital instances in the layout with instances in the schematic every time the design profile is loaded. Additionally, circuit designers might be provided with the ability to make changes per an ECO to the digital layout without creating connectivity mismatches between the flat layout and the schematic.

2. Flat Layout Tool

Figure 4:
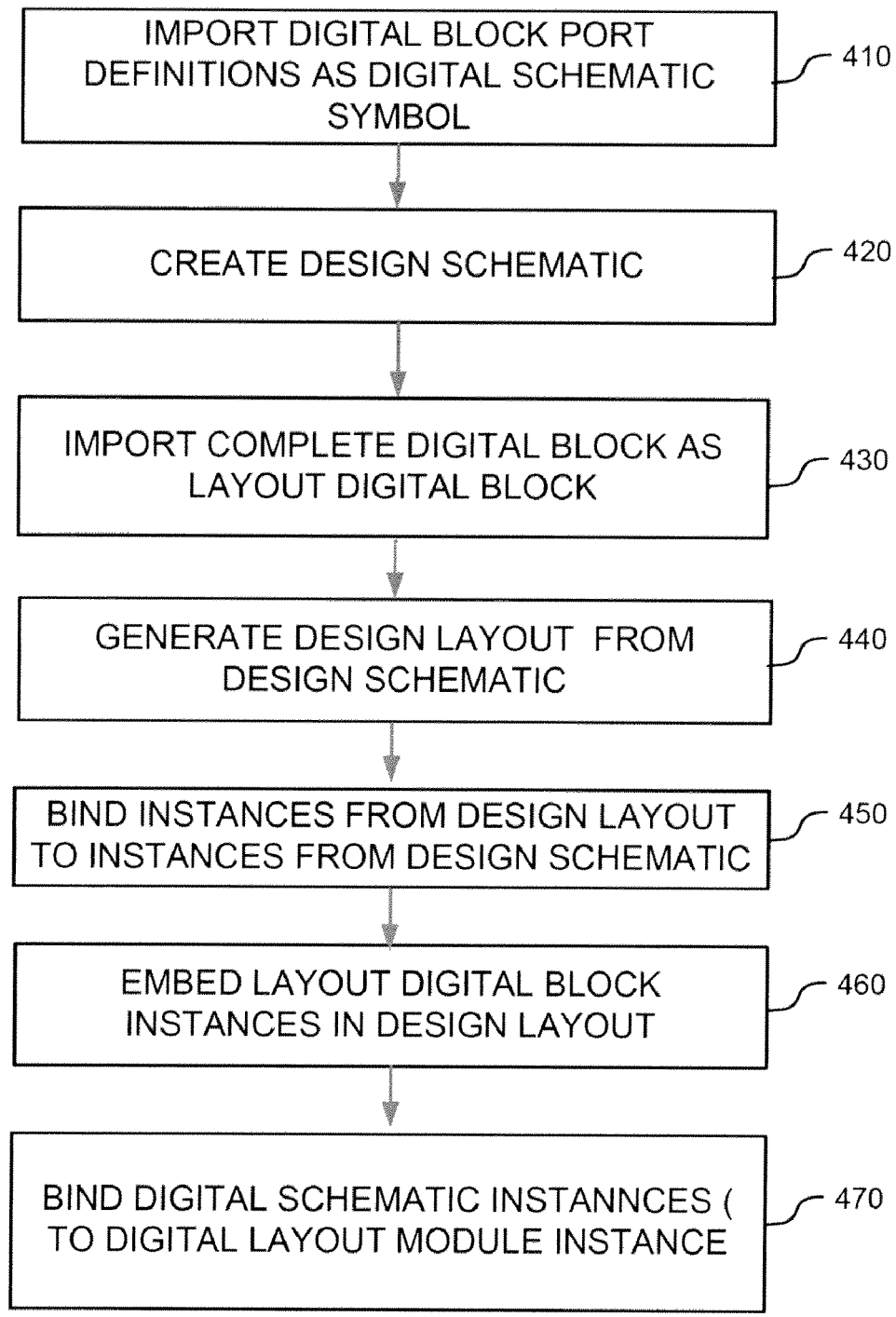

FIG. 4 illustrates a method 400 implemented by flat layout tool 260 to generate a flat circuit layout that is populated with both full custom/analog and digital instances according to one embodiment of the present invention. Method 400 starts at a block 410 in which port definitions of the HDL digital blocks are imported as digital schematic symbols. In a block 420, a design schematic is created using the digital schematic symbols created in block 410 and analog cell symbols are used to create a top level design schematic. Analog cell symbols may be obtained from a hierarchical full custom/analog schematic.

In block 430, digital blocks of a source such as, for example, a HDL file are imported as layout blocks. During this importation process, a HDL digital block top module is mapped to a top layout module within the layout block. Any HDL digital block sub-module is mapped to a layout sub-module within the layout block. Also, any HDL digital block module instance is mapped to a module instance within the layout block. Finally, any HDL digital block leaf instance (usually a standard cell) is mapped to a leaf instance within the layout block. Stated in another way, in block 430, a hierarchical digital block is mapped to a hierarchical layout block. Any sub-hierarchical digital block is mapped to a sub-hierarchical layout block.

In a block 440, the top-level design layout is automatically created from the top-level design schematic. In one embodiment, symbolic instances from the schematic design are instantiated and mapped to equivalent layout instances in the layout design. Preferably, all symbolic instances are instantiated and mapped to corresponding layout instances. As an example, a schematic instance of an NMOS transistor in the schematic design is mapped into a layout instance of the NMOS transistor in the layout design. As another example, the schematic instance of an HDL block (imported in block 410) in the schematic design is mapped into a layout instance of the same HDL block (imported in block 430) in the layout design.

In a block 450, each instance in the layout is bound to the corresponding instance in the schematic. This binding is useful for cross probing between the design schematic and the design layout. In one embodiment, this binding is used to report any connectivity mismatch between the design layout and the design schematic. In one embodiment, this binding happens concurrently with the layout generation done in block 440. In one embodiment, when both the design schematic and the design layout are loaded in application 260, the binding process is executed just after the designs are loaded.

In block 460, the digital block instances within the design layout are embedded in the design layout. This means each instance of a digital block is replaced by an instance of the top module of that digital block. In this way, the digital blocks are virtually flattened in the layout design. In one embodiment, the top module is a module having the highest hierarchy (i.e., at the highest level). Note that top module contains standard cells and/or other sub-modules, which in turns contains other standard cells and or other sub-modules.

In a block 470, digital instances within the design schematic are bound to digital module instance within the design layout. In one embodiment, this binding process happens concurrently while the digital blocks are embedded in block 460. In this way, any time both the design schematic and the design layout are loaded in application 260, block 470 is executed just after the designs are loaded.

As mentioned, as digital block instances within the design schematic are bound to the digital module instances within the design layout, the binder is not exposed to the standard cells within these digital module instances: the binder does not even visit these thousands of standard cells. This means very good binding performance anytime the design schematic and layout are opened and bound in applications like VLS-XL (260). Also, for the very same reasons, this means that any connectivity modifications done within these standard cells during digital timing and area optimization and during clock tree synthesis will not confuse the binder: again the binder will not visit those standard cells.

Further, method 400 creates isolation between the logical hierarchy of the analog full/custom parts and logical hierarchy of digital parts. This allows circuit designers to make changes per an ECO to the digital layout without creating connectivity mismatches between the flat layout and the schematic. Additionally, any changes made to the analog full/custom schematic instances can be propagated to corresponding layout instances. In this way, circuit designers will be able to see a flat circuit layout completely populated with analog full/custom and digital instances without having to wait for the binder to rebind all of the digital instances in the layout with instances in the schematic every time the design profile is loaded or changed.

Figure 5:
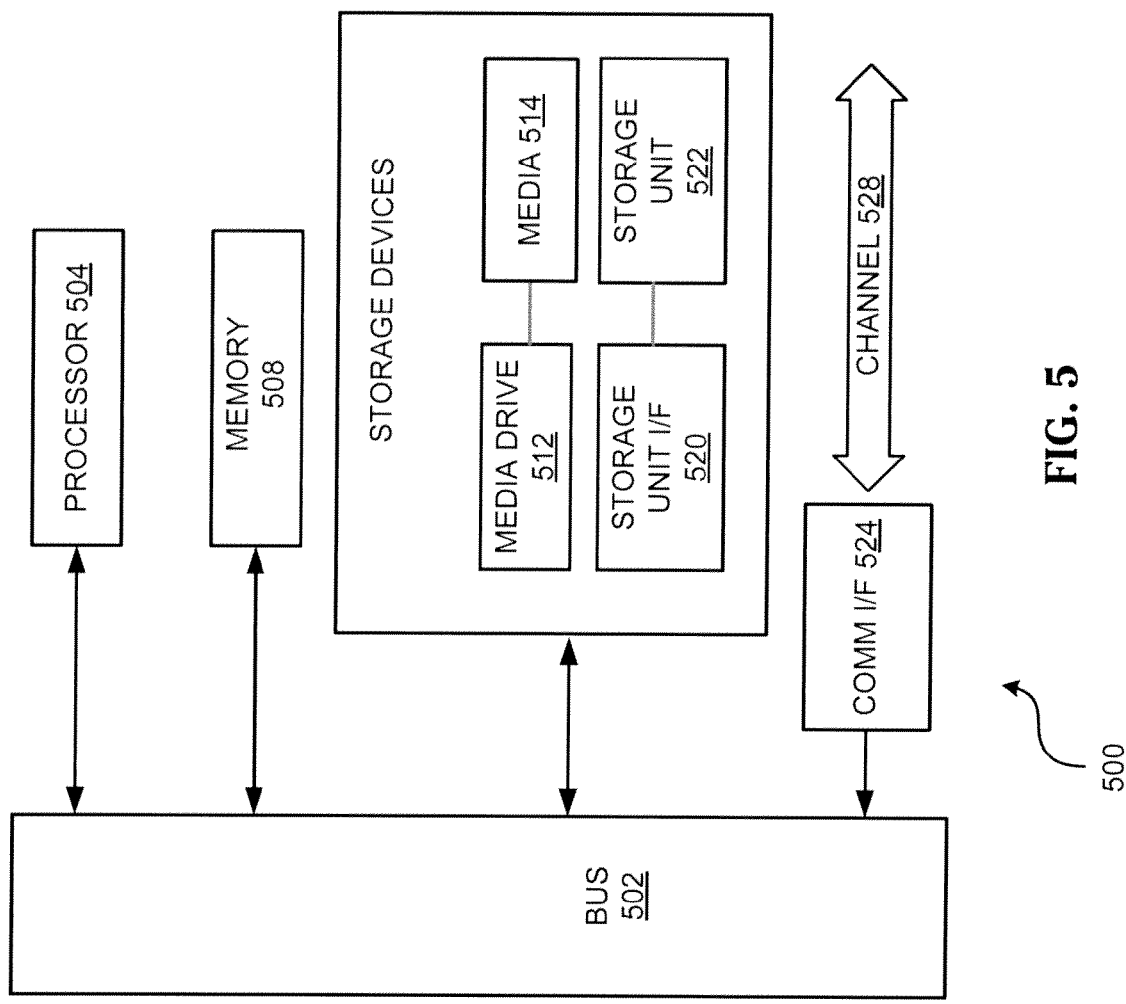
FIG. 5 illustrates an example computer system in which an embodiment of the present invention can be implemented.

As used herein, the term tool might describe a given unit of functionality that can be performed in accordance with one or more embodiments of the present invention. As used herein, a tool might be implemented utilizing any form of hardware, software, or a combination thereof. For example, software, firmware, one or more processors, controllers, ASICs, PLAs, logical components or other mechanisms might be implemented to make up a tool. In implementation, the various tools described herein might be implemented as discrete tools or the functions and features described can be shared in part or in total among one or more tools. In other words, as would be apparent to one of ordinary skill in the art after reading this description, the various features and functionality described herein may be implemented in any given application and can be implemented in one or more separate or shared tools in various combinations and permutations. Even though various features or elements of functionality may be individually described or claimed as separate tools, one of ordinary skill in the art will understand that these features and functionality can be shared among one or more common software and hardware elements, and such description shall not require or imply that separate hardware or software components are used to implement such features or functionality.

Where components or tools of the invention are implemented in whole or in part using software, in one embodiment, these software elements can be implemented to operate with a computing or processing tool capable of carrying out the functionality described with respect thereto. One such example computing tool is shown in FIG. 5. Various embodiments are described in terms of this example computing tool 500. After reading this description, it will become apparent to a person skilled in the relevant art how to implement the invention using other computing tools or architectures.

Referring now to FIG. 5, computing tool 500 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special or general purpose computing devices as may be desirable or appropriate for a given application or environment. Computing tool 500 might also represent computing capabilities embedded within or otherwise available to a given device. For example, a computing tool might be found in other electronic devices such as, for example, digital cameras, navigation systems, cellular telephones, modems, routers, WAPs, and any other electronic device that might include some form or processing capabilities.

Computing tool 500 might include one or more processors or processing devices, such as a processor 504. Processor 504 might be implemented using a general-purpose or special-purpose processing engine such as, for example, a microprocessor, controller, or other control logic. In the example illustrated in FIG. 5, processor 504 is connected to a bus 502 or other communication medium to facilitate interaction with other components of computing tool 500.

Computing tool 500 might also include one or more memory devices, referred to as main memory 508. For example, preferably random access memory (RAM) or other dynamic memory, might be used for storing information and instructions to be executed by processor 504. Main memory 508 might also be used for storing temporary variables or other intermediate information during execution of instructions to be executed by processor 504. Computing tool 500 might likewise include a read only memory ("ROM") or other static storage device coupled to bus 502 for storing static information and instructions for processor 504.

The computing tool 500 might also include one or more various forms of information storage mechanism 510, which might include, for example, a media drive 512 and a storage unit interface 520. The media drive 512 might include a drive or other mechanism to support fixed or removable storage media 514. For example, a hard disk drive, a floppy disk drive, a magnetic tape drive, an optical disk drive, a CD or DVD drive (R or RW), or other removable or fixed media drive. Accordingly, storage media 514, might include, for example, a hard disk, a floppy disk, magnetic tape, optical disk, a CD or DVD, or other fixed or removable medium that is read by, written to or accessed by media drive 512. As these examples illustrate, the storage media 514 can include a computer usable storage medium having stored therein particular computer software or data.

In alternative embodiments, information storage mechanism 510 might include other similar instrumentalities for allowing computer programs or other instructions or data to be loaded into computing tool 500. Such instrumentalities might include, for example, a fixed or removable storage unit 522 and an interface 520. Examples of such storage units 522 and interfaces 520 can include a program cartridge and cartridge interface, a removable memory (for example, a flash memory or other removable memory device) and memory slot, a PCMCIA slot and card, and other fixed or removable storage units 522 and interfaces 520 that allow software and data to be transferred from the storage unit 522 to computing tool 500.

Computing tool 500 might also include a communications interface 524. Communications interface 524 might be used to allow software and data to be transferred between computing tool 500 and external devices. Examples of communications interface 524 might include a modem or soft modem, a network interface (such as an Ethernet, network interface card, WiMedia, 802.XX or other interface), a communications port (such as for example, a USB port, IR port, RS232 port Bluetooth interface, or other port), or other communications interface. Software and data transferred via communications interface 524 might typically be carried on signals, which can be electronic, electromagnetic, optical or other signals capable of being exchanged by a given communications interface 524. These signals might be provided to communications interface 524 via a channel 528. This channel 528 might carry signals and might be implemented using a wired or wireless medium. Some examples of a channel might include a phone line, a cellular phone link, an RF link, an optical link, a network interface, a local or wide area network, and other wired or wireless communications channels.

In this document, the terms "computer program medium" and "computer usable medium" are used to generally refer to media such as, for example, memory 508, storage unit 520, media 514, and signals on channel 528. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing tool 500 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent tool names other than those depicted herein can be applied to the various partitions. Additionally, with regard to flow diagrams, operational descriptions and method claims, the order in which the blocks are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "tool" does not imply that the components or functionality described or claimed as part of the tool are all configured in a common package. Indeed, any or all of the various components of a tool, whether control logic or other components, can be combined in a single package or separately maintained and can further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for generating a flat design layout comprising:
   using a processor to import port definitions of a plurality of blocks of digital instances from a source as digital schematic symbols;
   creating a design schematic by using a processor to instantiate and connect the digital schematic symbols;
   importing the plurality of blocks of digital instances from the source as layout blocks;
   generating the flat design layout by using a processor to instantiate and interconnect layout blocks;
   binding digital instances within the flat design layout to respective instances within the design schematic; and
   replacing the instances of a digital layout block within the flat design layout with an instance of a top module of each respective digital layout block.

2. The method of claim 1, wherein creating the design schematic further comprises instantiating and connecting analog symbols.

3. The method of claim 1, wherein the source is one or more hardware description language (HDL) files.

4. The method of claim 1, wherein port definitions are imported as a symbol within an openAccess database.

5. The method of claim 1, wherein the design schematic is created within an openAccess database.

6. The method of claim 3, wherein the HDL source is imported as layout blocks within an openAccess database.

7. The method of claim 1, wherein importing further comprises:
   mapping a top module of a block from the source to a top module of a layout block within the design layout; and
   mapping any sub module of the blocks to a sub module of the layout blocks within the design layout.

8. The method of claim 1, further comprising mapping standard cells of the source to layout standard cells within the design layout.

9. The method of claim 1, wherein generating the design layout further comprises mapping each symbolic instance from the schematic design to an equivalent layout instance in the design layout.

10. The method of claim 9, wherein each instance in the layout is bound to the corresponding instance in the schematic.

11. The method of claim 1, wherein the top module of the digital layout block is the topmost module of the digital layout block.

12. The method of claim 1, wherein a first hierarchical layout block of the design layout is a topmost hierarchical layout block.

13. A method for generating a flat layout comprising:
   importing port definitions of a first and second hierarchical layout block from a source file by a processor as a first and a second schematic symbol to a schematic design, respectively, each of the hierarchical layout blocks having one or more digital instances;
   using a processor to instantiate the schematic symbols to a design schematic;
   importing each hierarchical layout block and its digital instances from the source file, wherein the second hierarchical layout block is a sub-hierarchy of the first hierarchical layout block;
   using a processor to instantiate the first and the second schematic symbol as a first and second hierarchical layout block within the flat layout, respectively;
   using a processor to instantiate digital instances of each hierarchical layout block as digital layout instances within the flat layout;
   binding the digital layout instances within the flat layout to respective digital instances of the first and the second schematic symbol; and
   replacing the digital instances of a hierarchical layout block within the design layout with instances of a top module of the respective digital instances of the hierarchical layout block.

14. The method of claim 13, wherein each analog instance in the layout is bound to the corresponding analog instance in the schematic.

15. A computer program product for generating a flat design layout, the product comprising a non-transitory computer-readable storage medium in which program instructions are stored, the program instructions are configured to cause a computer to:

import port definitions of a plurality of blocks of digital instances from a source as digital schematic symbols;

create a design schematic by instantiating and connecting the digital schematic symbols;

import the plurality of blocks of digital instances from the source as layout blocks;

generate the flat design layout by instantiating and interconnecting layout blocks;

bind digital instances within the flat design layout to respective instances within the design schematic; and replace the instances of a digital layout block within the flat design layout with instances of a top layout module of the respective instances of the digital layout block.

16. A system for generating a flat design layout comprising:

a user interface configured to accept input from a user and to display the flat design layout;

a processing device coupled to a monitor;

computer executable program code on a non-transitory computer readable medium configured to cause the processing device to:

import port definitions of a plurality of blocks of digital instances from a source as digital schematic symbols;

create a design schematic by instantiating and connecting the digital schematic symbols;

import the plurality of blocks of digital instances from the source as layout blocks;

generate the flat design layout by instantiating layout blocks;

bind digital instances within the flat design layout to respective instances within the design schematic; and replace the digital instances of a digital layout block with instances of a top layout module of the respective instances of the digital layout block of the design layout.

17. The system of claim 16, wherein the computer executable program code is further configured to cause the processing device to:

import port definitions of a plurality of blocks of digital instances from a source as digital schematic symbols;

create a design schematic by instantiating and connecting the digital schematic symbols; and import the plurality of blocks of digital instances from the source as layout blocks.

18. The system of claim 17, wherein the computer executable program code is further configured to cause the processing device to instantiate and connect analog symbols within the design schematic.

19. The system of claim 17, wherein the computer executable program code is further configured to cause the processing device to:

map a digital block top module from the source to a layout block top module within the design layout; and map any digital block sub-module to a layout block sub-module within the design layout.

20. The system of claim 17, wherein the computer executable program code is further configured to cause the processing device to map standard cells of the source to layout standard cells within the design layout.

* * * * *